United States Patent [19]

Lienhard et al.

[11] 4,385,273

[45] May 24, 1983

[54] TRANSDUCER FOR MEASURING A CURRENT-GENERATED MAGNETIC FIELD

[75] Inventors: Heinz Lienhard, Zug; Gernot Schneider, Baar, both of Switzerland

[73] Assignee: LGZ Landis & Gyr Zug AG, Zug, Switzerland

[21] Appl. No.: 188,339

[22] Filed: Sep. 18, 1980

[30] Foreign Application Priority Data

Nov. 27, 1979 [CH] Switzerland ................... 10520/79

[51] Int. Cl.$^3$ ..................... G01R 33/00; G01R 1/20; G01R 33/02
[52] U.S. Cl. ............................. 324/117 R; 324/142; 324/249
[58] Field of Search .............. 324/249, 117 R, 117 H, 324/142

[56] References Cited

U.S. PATENT DOCUMENTS 3,621,382  11/1971  Valet .................................. 324/249

FOREIGN PATENT DOCUMENTS 1951230  4/1970  Fed. Rep. of Germany .
1911286  9/1970  Fed. Rep. of Germany .
2701296  4/1978  Fed. Rep. of Germany .
2000873  1/1979  United Kingdom .

OTHER PUBLICATIONS

Bajorek et al.; "Magnetoresistive Current Sensor"; IBM Tech. Dis. Bull.; vol. 18; No. 8; Jan. 1976; pp. 2745-2748.
Bajorek et al.; "A Permalloy . . . "; IEEE Trans. on Magnetics; vol. MAG-12; No. 6; Nov. 1976; pp. 813-815.

*Primary Examiner*—Ernest F. Karlsen
*Attorney, Agent, or Firm*—Ernest F. Marmorek

[57] ABSTRACT

A current-measurement transducer comprises a thin-film magnetic coil for passing an alternating premagnetizing current, generating an alternating premagnetizing field, and a magnetic-field comparator which includes first and second magnetic anisotropic films disposed in respective substantially parallel planes. Each film is composed of ferromagnetic and magnetoresistive material, and defines a magnetic easy axis, along which the film is relatively easily magnetizable, and a magnetic hard axis, at right angles to the easy axis, along which the film is harder to magnetize than along the easy magnetic axis. A non-magnetic and electrically at least poorly conducting layer separates the films, and the films are coupled to one another sufficiently tightly so that a current passing in one magnetic film generates an auxiliary magnetic field along the hard magnetic axis of the other magnetic film.

16 Claims, 17 Drawing Figures

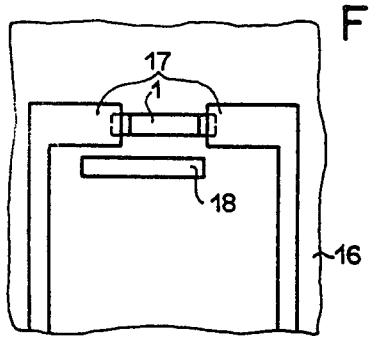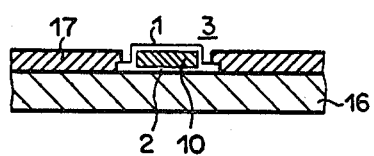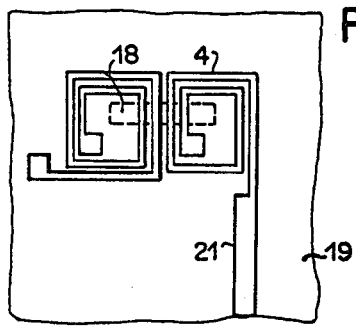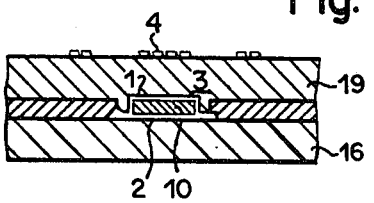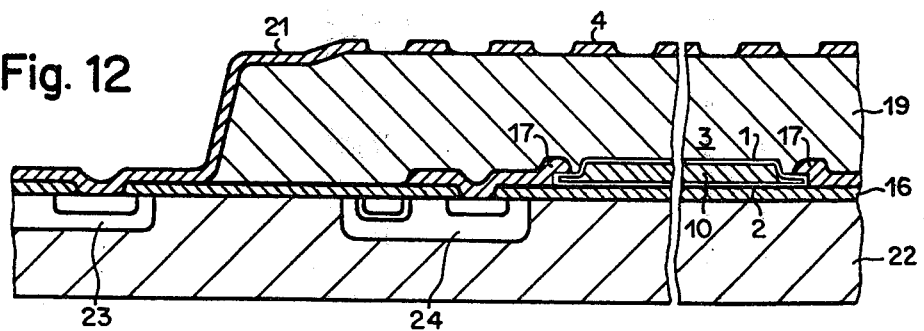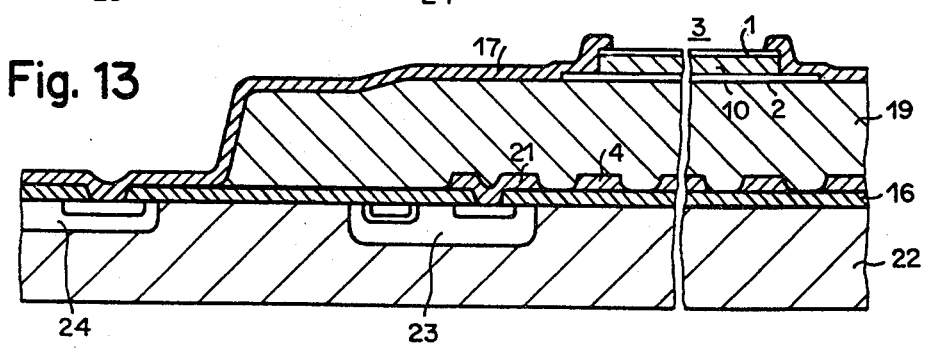

1

TRANSDUCER FOR MEASURING A CURRENT-GENERATED MAGNETIC FIELD

BACKGROUND OF THE INVENTION

From U.S. Pat. No. 3,621,382 an apparatus for measurement of magnetic fields is known in which a thin ferro-magnetic layer is used, which is easily magnetizable in one axis, the so-called easy axis, but more difficult to magnetize in an axis at right angles thereto, the so-called hard axis. The field, whose field strength is to be measured, acts upon the ferro-magnetic layer, and the apparatus includes a device for generating a symmetrical periodic alternating field, which field extends in a direction parallel to the easy axis of the ferro-magnetic layer, and wherein the alternating field is generated by a pumping coil. A detection coil is wound around the easy axis. A steady biasing field is applied along the hard axis, at least if the thin film is a flat strip. The value of the field component along the easy axis is deduced from the time difference between successive reversals of the magnetic vector in the strip from the amplitude of the harmonic 2f of the signal frequency f in the detection coil.

There is also known a current-measuring system of the type in which the magnetic flux from a current to be measured is superimposed upon the flux from a cyclically varying biasing current, and the flux reversals in the resulting flux are detected by using a thin film a few microns thick, of magnetic material, desaturation of which, as the flux reversals occur, is detected, either by the change of flux in the main magnetic circuit, or by the change in the resistance of the film, separate contacts being attached to the film for this purpose. The so-called easy axis of the magnetic film, alternately called preferential direction of magnetization, may be disposed parallel, at right angles to, or at an angle of, for example, 45°, to the direction of the external magnetic field acting on the magnetic film. The magnetic coil for generating the premagnetizing field uses a flat coil made of a tape or wire, or a copper spiral in the form of an etched printed circuit.

From the IEEE transaction on Magnetics, Volume MAG-12, No. 6, November, 1976, pages 813-815, there is also known a linearly operating current detector, which includes four magnetic film pairs of magneto-resistive material in the form of a bridge circuit. The current to be measured generates a magnetic external field, directed in the direction of the hard magnetic axis of the magnetic films, and which in turn causes a steady rotation of magnetization of the magnetic films beyond their easy axis. This in turn results in a linear dependence of the resistances of the magnetic film within its effective controllable range, and consequently in a voltage, which can be obtained from the bridge circuit derived from the current to be measured.

SUMMARY OF THE INVENTION

It is therefore one of the principal objects of the present invention to improve the somewhat unsteady switching response of a magnetic field comparator of a measurement transducer of the aforedescribed kind, and to devise a measurement transducer which can be manufactured using modern mass-production methods at a relatively low cost. The invention is based on the recognition, that it is advantageous to control a magnetic film through its easy magnetic axis in a measurement transducer which has become known from the British Patent Application No. GB 2,000,873 A, and that it is additionally desirable to reduce the length and width of the magnetic film as much as possible, which is not, however, easily achieved, as the thickness of the magnetic film cannot be made arbitrarily small, due to a resulting demagnetization thereof.

This, and other objects can be achieved, according to the present invention, by a measurement transducer which comprises thin-film magnetic coil means for passing an alternating premagnetizing current, which in turn generates an alternating premagnetizing field, and magnetic-field comparator means, disposed near the thin-film magnetic coil means, including first and second magnetic anisotropic films disposed in respective substantially parallel planes, and wherein each film is composed of ferromagnetic and magnetoresistive material, and defines a magnetic easy axis along which the film is relatively easily magnetizable, and a magnetic hard axis, at right angles to the easy axis, along which the film is harder to magnetize than along the easy magnetic axis. A non-magnetic and electrically poorly conducting layer separates said films, and the films are coupled to one another sufficiently tightly so that a current passing in one magnetic film generates an auxiliary magnetic field along the hard magnetic axis of the other magnetic film.

This arrangement results in an external magnetic field made up of the vectorial sum of a magnetic field to be measured and of the alternating premagnetizing field acting on the magnetic-field comparator means driving each film into alternate saturation regions, each region being saturated by a magnetic vector rotating progressively from the easy magnetic axis during each alternate saturation phase, and wherein one magnetic vector rotates in a direction opposite to the other magnetic vector to an arbitrary peak excursion angle beyond the hard magnetic axis, and each magnetic film changes its resistance in a jump-like manner at about the time when the vectorial sum of the fields crosses a zero value, so that the time occurance of the resistance change is a measure of the value and sign of the magnetic field to be measured.

Other objects of the invention will in part be obvious, and will in part appear hereinafter, certain embodiments of the same being illustrated in the accompanying drawings, and described in the specification.

BRIEF DESCRIPTION OF THE DRAWINGS

For a fuller understanding of the nature and objects of the invention, reference should be had to the following detailed description, taken in connection with the accompanying drawings, in which:

FIG. 8 is a plan view of a substrate including a magnetic field comparator;

FIG. 9 is a section through the substrate shown in FIG. 8;

FIG. 10 is a plan view of a substrate as shown in FIG. 8, including a coil implemented as a thin film;

FIG. 11 is a section through the arrangement of FIG. 10;

FIG. 12 is one version of a measurement transducer manufactured according to integrated circuit technology methods;

FIG. 13 is another version of a measurement transducer manufactured by integrated circuit technology methods;

DESCRIPTION OF THE PREFERRED EMBODIMENTS

Figure 1:
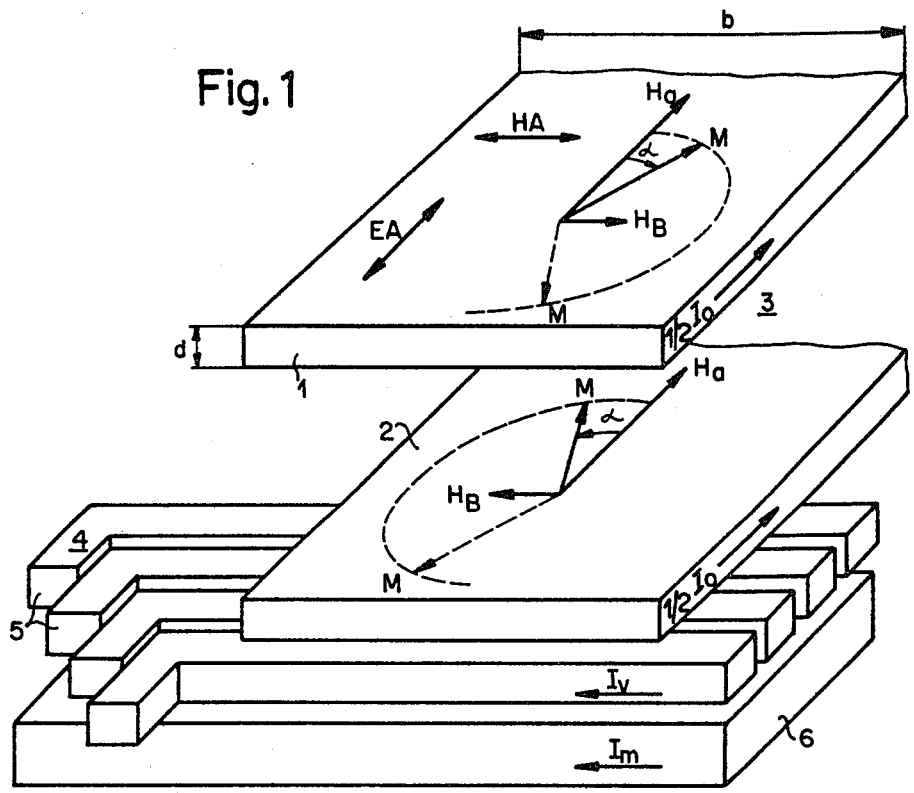
FIG. 1 is a schematic view of the measurement transducer, according to the present invention.

In carrying the invention into effect, and referring now particularly to FIG. 1, a magnetic field comparator 3 is formed by two similar anisotropic magnetic films of equal thickness made of ferromagnetic material having also, to some extent, magnetoresistive properties. The magnetic films are juxtaposed along parallel planes and separated by a non-magnetic and electrically insulated layer 10 (illustrated in FIGS. 5, 9, 11, 12 and 13) of relatively small thickness, or at least a layer whose conductivity is poor. The magnetic films 1 and 2 are connected to a (non-illustrated) current source which supplies a current $I_o$, so that a current $\frac{1}{2}I_o$ passes through each magnetic film 1 and 2 along its longitudinal direction. The easy magnetic axis EA extends along the longitudinal direction, and the hard magnetic axis HA extends along the cross-section of the magnetic films 1 and 2 in a direction generally perpendicular to the easy magnetic axis EA.

A magnetic coil 4 is disposed in another plane parallel to the planes of the magnetic films 1 and 2, and is implemented as a thin-film coil which has a conductive path in the form of a rectangular spiral, so that individual windings 5 thereof are disposed parallel to the hard magnetic axis HA in the region in which they are magnetically coupled to the magnetic films 1 and 2. The magnetic coil 4 carries an alternating premagnetization current $I_v$ whose relationship to the magnetic field it generates is predefined. This premagnetization current $I_v$ generates a premagnetization field in the magnetic films 1 and 2 in the direction of their respective easy magnetic axes EA. If a magnetic field to be measured additionally acts on the magnetic field comparator 3 in the direction of the easy magnetic axes EA, then there arises along a respective easy magnetic axis EA an external magnetic field $H_a$, which corresponds to the sum of the magnetic field to be measured, and the premagnetization field. In the example illustrated, the magnetic field to be measured is generated by a measurement current $I_m$, which flows in the direction of the hard magnetic axis HA in a flat or strip conductor 6.

If the magnetic films 1 and 2 are sufficiently tightly coupled, then a current $\frac{1}{2}I_o$ flowing in the magnetic film 2 generates a magnetic auxiliary field $H_B$ in the hard magnetic axis HA of the magnetic film 1, which is directed to the right as seen in FIG. 1. In an analogous fashion, a current $\frac{1}{2}I_o$ flowing through the magnetic film 1 generates in the hard magnetic axis HA of the magnetic film 2 an auxiliary field $H_B$ directed towards the left as seen in FIG. 1. As a result of these auxiliary fields, and when $H_a$ is equal to zero, the magnetization vector M of the magnetic films 1 and 2 is not disposed along the easy magnetic axis EA, but is angularly displaced by a certain angle alpha from the easy magnetic axis EA. This rotation of the magnetizing vector M takes place clockwise in the magnetic film 1, and counter-clockwise in the magnetic film 2.

Figure 2:
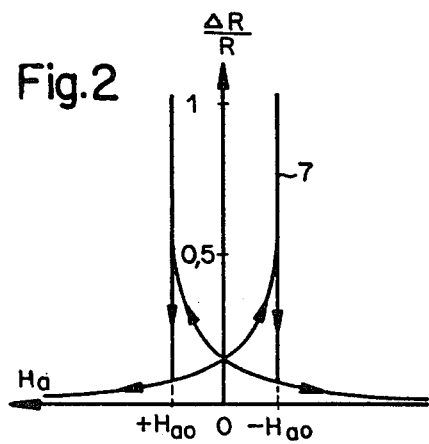
FIG. 2 is a diagram of the incremental resistance change vs. the applied external magnetic field.
Figure 3:
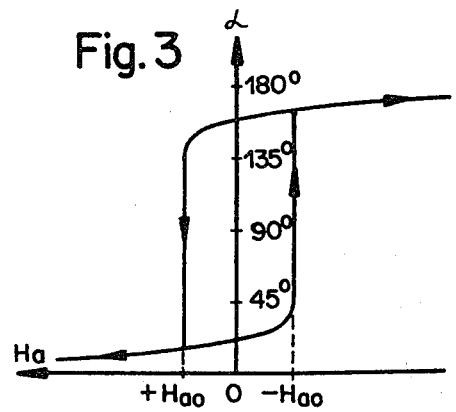
FIG. 3 is a diagram of the angle of rotation of a magnetizing vector vs. the applied external magnetic field.

If the external magnetic external field $H_a$ increases negatively, namely changes in a direction opposite to its previous direction, then the magnetization vector M rotates initially in steady manner in the same direction, namely the angle alpha progressively increases as shown in FIG. 3, which FIG. shows the dependence of the angle alpha on the external field $H_a$. After the magnetizing vector M passes a certain threshold point, however, which can be determined according to the well-known Stoner-Wohlfahrt model, the magnetization vector M becomes unsteady, that is, it becomes independent of the rate of change of the external field $H_a$, rotates beyond the hard magnetic axis HA, and assumes a new equilibrium position shown dotted in FIG. 1. Here the magnetic films 1 and 2 change their ohmic resistance R jump-wise, as can be seen from FIG. 2, which shows the dependence of the incremental resistance in dependence of the external field $H_a$. There do appear pronounced and steep switching peaks 7, which reflect themselves in an appropriate voltage change across the magnetic films 1 and 2, can be easily detected, and mark the zero crossing of the external field $H_a$ with high accuracy. The unsteady switching of the magnetic films 1 and 2 does not, however, occur exactly during the zero crossing of the external field $H_a$, but when the external field assumes at least a strength $H_{ao}$ and therebeyond, so that a hysteresis of a value $2H_{ao}$ occurs. As will be shown later, this hysteresis is exceedingly small, even if the lateral dimensions of the magnetic films 1 and 2 are not very large in relation to the thickness of the layer d.

The hysteresis is dependent of the anisotropic fields $H_k$ and the demagnetization field $H_D$ arising in the hard magnetic axis HA of the magnetic films 1 and 2. If the second magnetic film 2 is considered absent, and if the thickness of the layer d of the magnetic film 1 in comparison to its width b is very small, then the demagnetization field $H_D$ is negligible, and the hysteresis is determined substantially by the anisotropic field strength; when the thickness of the layer d is relatively large, then the demagnetization field $H_D$ is however, strong, and has a considerable influence on the hysteresis.

The magnetizing vectors M, as has already been described, rotate in respective opposite senses in the case of the aforementioned magnetic field comparator 3, when the switching of magnetic films 1 and 2 is reversed. If the magnetic films 1 and 2 are sufficiently tightly coupled, namely if their spacing from one another in relation to their respective widths b is sufficiently small, then the demagnetization fields $H_D$ along the hard magnetic axes HA are largely compensated as the result of the opposite rotation of the magnetizing vectors M, so that in practice any demagnetization increasing the hysteresis does not, in fact, occur. The distance between the magnetic films 1 and 2 may not, however, be smaller than about 10 nm, so that any so-called exchange-coupling is avoided.

Depending on the magnitude of the auxiliary field $H_B$, both the hysteresis, as well as the form of the switching peaks 7 change. In the case of a relatively large auxiliary field $H_B$, the magnetization vector M is always angularly displaced at a relatively large angle from the easy magnetic axis EA, which results in a very small hysteresis, but in somewhat less pronounced switching peaks 7; when the auxiliary field $H_B$ is small, there occur particularly pronounced peaks, and a relatively larger hysteresis. An optimal compromise is obtained, if the field strength of the auxiliary field $H_B$ amounts to about ⅓ of the anisotropic field strength $H_K$.

As has already been stated, in the magnetic field comparator 3 described, and contrary to the state of the art, it is not required that the ratio b/d be very large. As the thickness of the layer d cannot be in practice selected to be arbitrarily small, in known magnetic field comparators relatively large length- and width-dimensions are necessary, in order to maintain the hysteresis and the demagnetization within acceptable limits. In the afore-described magnetic field comparator 3 it is, however, possible to employ extraordinarily small magnetic films 1 and 2 having a length l, for example, ranging between 10–100 microns, and a width b ranging from about 2–20 microns.

Experiments conducted with a magnetic field comparator 3 having parameters of:
l = 100 microns
b = 20 microns
d = 20 nm
$H_K$ = 480 A/m
$H_B$ = ⅓ $H_K$ = 160 A/m
have yielded a reversal switching field strength $H_{ao}$ of approximately 160 A/m. If the second magnetic film 2 were to be omitted, then with the dimensions remaining the same, a demagnetization field strength in the hard magnetic axis, and therefore a reversal switching field strength of about 1,600 A/m would be obtained.

The small dimensions of the magnetic films 1 and 2 make it possible to implement the magnetic coil 4 as a thin-film coil, using modern and cost-effective manufacturing methods, so that the thin-film coil has few windings. The windings of the thin-film coil may be disposed in a common plane. It is further possible to arrange the individual windings of the thin-film coil in a known manner, so that they are superimposed with respect to one another, and to insulate the windings by means of respective insulation layers disposed between the windings. Other advantageous implementations of a thin-film coil will be explained in relation to FIGS. 16 and 17 later.

Furthermore, as a result of the small dimensions of the magnetic films 1 and 2, and consequently also of the magnetic coil 4, it is possible to employ a relatively small premagnetization current Iv, and nevertheless generate a premagnetization field of a high field strength, which permits measurement of relatively strong magnetic fields.

Figure 4:
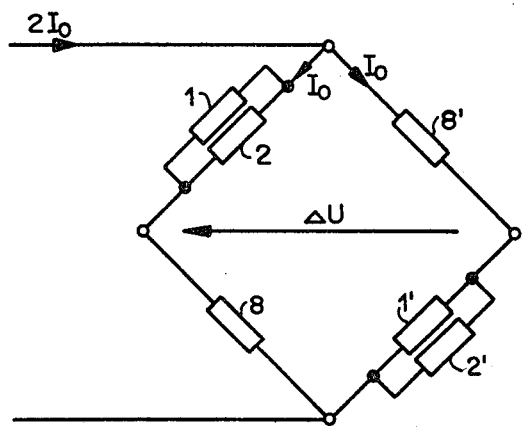
FIG. 4 is a schematic diagram of magnetic films coupled in a bridge-configuration.

Advantageously, and according to FIG. 4, the magnetic film pair 1 and 2, a second similar magnetic film pair 1' and 2', as well as two further magnetic films 8 and 8' form an electrical bridge. If the resistances of all four bridge elements in the quiescent state are equal, and if a current $2I_o$ is fed to the bridge circuit, then during switching reversals of the magnetic films 1 and 2 and 1' and 2', there arises a voltage impulse $\Delta U = (\Delta R) \cdot I_o$, while in the quiescent state the voltage across the bridge diagonal is equal to zero. The magnetic films 1 and 2, and 1' and 2', and 8 and 8' are advantageously fabricated from the same material, and by the same photolithographic process, but the magnetic films 1 and 2, and 1' and 2' have a layer thickness d each, while the magnetic films 8 and 8' have a layer thickness of 2 d. This ensures a uniform temperature change of all magnetic films of the bridge circuit. Furthermore, it is not necessary to screen the magnetic films 8 and 8' with respect to an external field $H_a$, as no auxiliary field $H_B$ is induced therein, and the demagnetization remains dominant, so that during remagnetization of the magnetic films 8 and 8', and using typical field strengths encountered in practice, there does not occur any significant change in the resistance of the magnetic films 8 and 8'.

Figure 5:
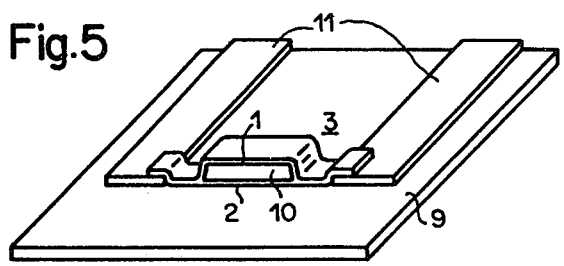
FIG. 5 is a perspective view of a substrate including a magnetic field comparator.
Figure 7:
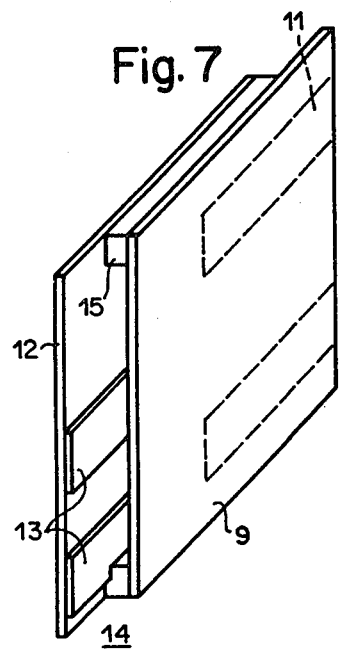
FIG. 7 is a perspective view of a measurement transducer.
Figure 6:
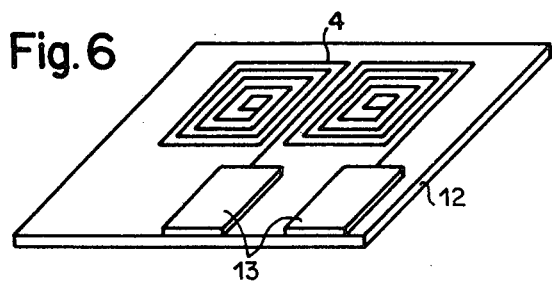
FIG. 6 is a perspective view of a substrate including a coil in the form of a thin film.

A simple implementation example of the measurement transducer will now be explained in relation to FIGS. 5 through 7. In FIG. 5, there is shown a substrate 9, on which there is disposed the magnetic field comparator 3, two magnetic films 1 and 2, as well as an insulation layer 10. The two ends of the longitudinal magnetic films 1 and 2 are connected to respective conductive paths 11. The magnetic coil 4 is disposed on a second substrate 12, and is formed, in the example illustrated, by a double spiral, wherein the outer spiral ends are each connected to respective conductive paths 13, while the inner ends of the spiral are connected to one another, for example, by through-plated contacts. The conductive paths 11 and 13, as well as the magnetic coil 4, consist, for example, of gold, copper or aluminum. The magnetic coil 4 is manufactured according to known photolithographic thin-film manufacturing processes. Both thin-film or thick-film manufacturing processes are suitable for applying the conductive paths 11 and 13 to the respective substrates. The substrates 9 and 12 are united, according to FIG. 7, by soldering, sticking to one another, or the like, to a rigid block 14 in such a manner, that the ends of the conductive paths 11 and 13 remain accessible as contacts, and so that the magnetic field comparator 3 is disposed at a predefined distance, for example, of several microns, from the magnetic coil 4, and located at a location, where the premagnetization field remains practically constant over the whole active magnetic length of the magnetic films 1 and 2. This can be accomplished by an embossed rim of the substrate 15, by insertion of a foil, or by lowering of the magnetic field comparator 3 or the magnetic coil 4 into the substrate 9 or the substrate 12, respectively. The block 14 may, together with an integrated circuit, which includes the required electronic components of the measurement transducer, be encapsulated in a common housing, which may, for example, be secured to the flat conductor means 6, as shown in FIG. 1.

According to FIGS. 8 through 12, the magnetic field comparator 3 and the magnetic coil 4 may be disposed on a common substrate 16, which is advantageously accomplished by the following steps:

(1) the magnetic film 2 is applied onto the substrate 16 (FIGS. 8 and 9), (2) the insulation layer 10 is applied to the magnetic film 2, while the ends of the magnetic film 2 remain free (FIGS. 8 and 9), (3) the magnetic film 1 is applied in a manner analogous to the method used in step 1 (FIGS. 8 and 9), (4) the conductive paths 17 are applied onto the substrate 16, wherein the ends of the magnetic films 1 and 2 make contact with the conductive paths 17, and there is also applied a return path 18 for the two halves of the magnetic coil (FIGS. 8 and 9), (5) the arrangement is covered by an insulation layer 19, for example, of $SiO_2$, two (non-illustrated) windows being formed through the insulation layer 19 to the ends of the return path 18 (FIGS. 10 and 11), (6) the magnetic coil 4 is applied to the insulation layer 19 inclusive of conductive paths 21 serving as connectors (FIGS. 10 and 11).

The steps (2), (4), (5), (6) can be accomplished by conventional integrated circuit technology methods. It is advantageous if the magnetic field comparator 3, and the magnetic coil 4 are disposed on a semiconductor wafer, which forms a monolithic integrated circuit with the required electronic components of the measurement transducer. Here steps (2) and (5) can be combined with appropriate insulation steps, and steps (4) and (6) can be combined with corresponding contacting steps during manufacture of the integrated circuit, so that only the additional steps (1) and (3) are required beyond those used during the conventional manufacture of integrated circuits.

FIG. 12 is a cross-sectional view of a measurement transducer using such a semiconductor plate 22, on which there are disposed a magnetic field comparator 3, and a magnetic coil 4. Although the individual layers have a somewhat different form than those shown in FIGS. 8 through 11, in FIG. 12 those elements which have the same functions as equivalent elements in FIGS. 8 through 11, have been designated with similar reference numerals. The semiconductor plate 22 includes inter alia two transistors 23 and 24, of which one is connected via the conductive path 21 to the magnetic coil 4, and supplies the premagnetization current $I_v$ (FIG. 1), while the other is connected via the conductive path 17 to the magnetic field comparator 3, and supplies a current $I_o$ thereto.

In FIG. 13 reference numerals similar to those in FIG. 12 provide similar functions. The measurement transducer according to FIG. 13 differs from that of FIG. 12 substantially by the fact that the magnetic coil 4 is disposed between the semiconductor plate 22 and the magnetic field comparator 3.

Figure 14:
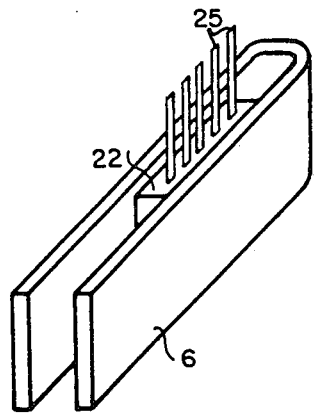
FIG. 14 is a perspective view of a measurement transducer including a measurement conductor.

The semiconductor plate 22 with the magnetic field comparator 3 and the magnetic coil 4 can be provided in a conventional manner with electrical contacts and encapsulated in a housing. Here the flat conductor means 6 (FIG. 1) can serve as part of the housing similar to a heat sink of a power transistor. It is advantageous if the flat conductor 6, according to FIG. 14, is bent into a U-shape, and if the semiconductor plate 22 is disposed between the legs of the U-shaped flat conductor 6, so that the electrical connections 25 are disposed laterally between the legs of the U-shaped flat conductor 6. The magnetic field generated by the measuring current $I_m$ is maximum between the legs of the flat conductor 6, and practically zero exterior thereto. By applying a soft magnetic layer to the outer surfaces of the flat conductor 6, an additional magnetic screening is obtained.

Figure 15:
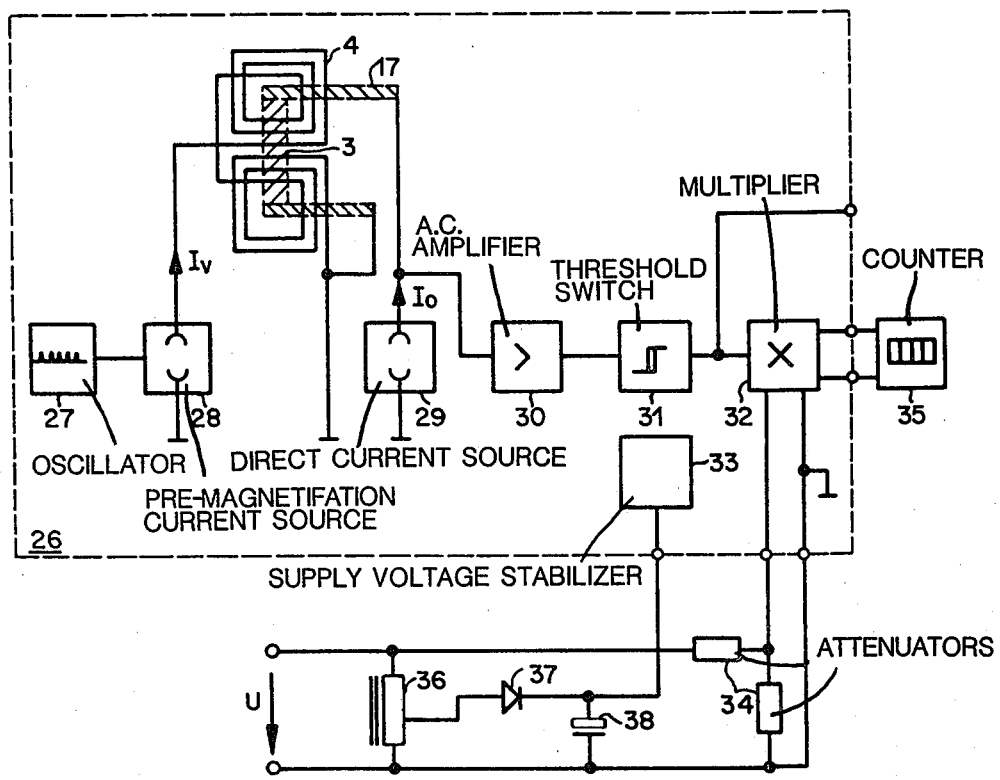
FIG. 15 is a schematic circuit of a static electricity meter including a measurement transducer.

An electric schematic circuit diagram of the integrated circuit formed by the semiconductor plate 22 with a magnetic field comparator 3 and the magnetic coil 4 is shown in FIG. 15 within a circuit block 26. The circuit block 26 includes an oscillator 27, a premagnetization current source 28, feeding the magnetic coil 4, a direct current source 29, supplying current to the magnetic field comparator 3, an alternating current amplifier 30 postcoupled to the magnetic field comparator 3, a threshold switch 31, postcoupled to the amplifier 30, a multiplier 32 or another signal processing element, be it analog or digital, postcoupled to the threshold switch 31, a supply voltage stabilizer 33, and the conductive path 17 making contact with the magnetic field comparator 3.

The oscillator 27 generates impulse sequences of a constant frequency, which control the premagnetizing current $I_v$. The direct current source 29 supplies a current $I_o$ to the magnetic field comparator 3. The alternating current potential developed across the magnetic field comparator 3 is amplified by the alternating current amplifier 30, and passes to the threshold switch 31, which generates an impulse for all intents and purposes when the exterior field strength $H_a$ crosses through zero. In the event of a predefined shape of the alternating premagnetizing current $I_v$, the time intervals during which these pulses occur provide a measure for the instantaneous value and sign of the magnetic field applied to the measurement transducer, or the current passing through the flat conductor 6. An analog or digital signal can be formed in the multiplier or signal processor 32 based on this time interval, and corresponding to the momentary value of the current.

The measurement transducer described is particularly suitable for the measurement of electrical energy. For this purpose the alternating current to be measured is directly fed to the flat conductor 6, and according to FIG. 15 the voltage U to be measured is fed for example, through an attenuator 34 to the multiplier 32, and passes therefrom to a counter 35. The multiplier 32 forms a product of the instantaneous value of the alternating current measured by the measurement transducer and the instantaneous value of an externally applied alternating voltage, such as the voltage U, and a counter 35 forms the time integral of that product.

In order to supply the circuit block 26 with the alternating voltage U, that voltage is transformed into a low D.C. voltage by means of a transformer 36, a rectifier 37 and a capacitor 38, and supplied to the voltage stabilizer 33.

For the purpose of measuring electrical energy in a multi-phase alternating current network, it is advantageous if the measurement transducer of the aforedescribed kind is used for each electrical phase, so that the product for each phase can be formed in the multiplier 32 of the circuit block 26 of the corresponding phase, or may be formed in a microcomputer common to all electrical phases.

Figure 16:
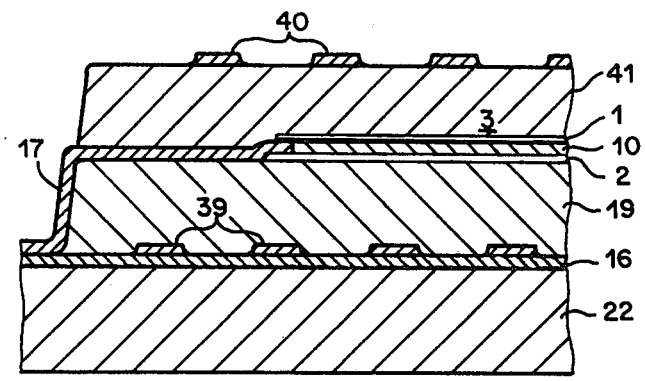
FIG. 16 is a cross-section of another version of a measurement transducer.
Figure 17:
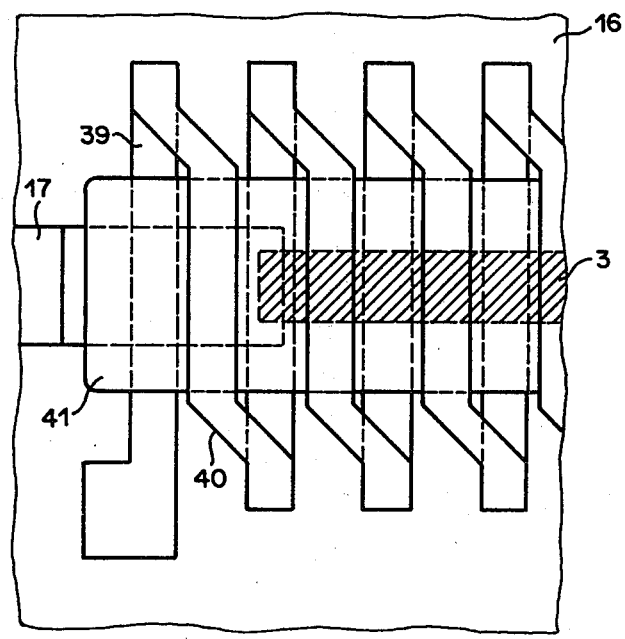
FIG. 17 is a plan view of the measurement transducer shown in FIG. 16.

In FIGS. 16 and 17 similar reference numerals denote elements performing the same functions as those in the previous figures. The magnetic coil implemented as a thin-film coil consists in the measurement transducer, according to FIGS. 16 and 17, of a first group of conductive paths 39 disposed in a first plane, and of a second group of parallel conductive paths 40 disposed in a second plane. The current paths 39 are disposed below the magnetic field comparator 3 in an insulation layer 16 applied to the semiconductor plate 22, and are insulated from the magnetic field comparator 3 by the insulating layer 19. The conductive paths 40 are disposed above the magnetic field comparator 3 on an insulation layer 41. The insulation layers 19 and 41 do not cover the conductive paths 39 completely, but leave their ends freely accessible. The two ends of each conductive path 40 are each Z-shaped and connected to ends of respective adjacent conductive paths 39. A flat magnetic coil 4 has a conductive length which is a multiple of that of a magnetic coil consisting of the conductive paths 39 and 40 when the number of windings for each type of magnetic coil remain the same.

The demagnetization fields arising in the magnetic films 1 and 2 can be eliminated completely, if the two magnetic films 1 and 2 are connected to one another along their longitudinal rims, for example, if the width b of the insulation layer 10 (FIGS. 5, 9, 11, 12, 13, 16) is somewhat smaller than the width b (FIG. 1) of the magnetic films, so that a closed path is available for the magnetic flux in the direction of the hard magnetic axis HA.

We wish it to be understood that we do not desire to be limited to the exact details of the construction shown and described, for obvious modifications will occur to persons skilled in the art.

Having thus described the invention, what we claim as new and desire to be secured by Letter Patent, is as follows:

1. A measurement transducer
comprising in combination:
thin-film magnetic coil-means for passing an alternating premagnetizing current, generating an alternating premagnetizing field, and
magnetic-field comparator means, disposed near said thin-film magnetic coil means, including
first and second magnetoresistive anisotropic magnetic thin films disposed in respective substantially parallel planes, each film consisting of ferromagnetic material, and defining a magnetic easy axis along which the film is relatively easily magnetizable, and a magnetic hard axis, at right angles to the easy axis, along which the film is harder to magnetize than along the easy magnetic axis, the magnetic easy axes of said films being parallel to each other, and
a non-magnetic and electrically poorly conducting layer separating said films,
said films being connected to one another, adapted to be connected to a current source for passing current therethrough, and being coupled to one another sufficiently tightly so that a current passing in said first magnetic film generates an auxiliary magnetic field along the hard magnetic axis of said second magnetic film, and a current passing in said second magnetic film generates an auxiliary magnetic field along the hard axis of said first magnetic film,
whereby an external magnetic field made up of the vectorial sum of a magnetic field to be measured and of said alternating premagnetizing field acting on said magnetic-field comparator means drives each film into alternate saturation regions, each region being saturated by a magnetic vector rotating progressively from said easy magnetic axis during each alternate saturation phase, to an arbitrary peak excursion angle beyond said hard magnetic axis, and wherein one magnetic vector rotates in a direction opposite to the other magnetic vector, and each magnetic film changes its resistance in a jump-like manner at about the time when said vectorial sum of said fields crosses a zero value, so that the time occurrence of said resistance change is a measure of the value and sign of the magnetic field to be measured.

2. A measurement transducer as claimed in claim 1, wherein the width of one magnetic film is similar to that of the other, and wherein said non-magnetic and electrically poorly conducting layer extends at least over said width.

3. A measurement transducer as claimed in claim 1, further comprising a first substrate, said magnetic-field comparator means being disposed on said first substrate, and a second substrate, said thin-film magnetic coil means being disposed on said second substrate, and wherein said substrates are united in a rigid block.

4. A measurement transducer as claimed in claim 1, further comprising a common substrate, said magnetic-field comparator means and said thin-film magnetic coil means being disposed on said common substrate.

5. A measurement transducer as claimed in claim 1, further comprising a semiconductor plate, said magnetic-field comparator means and said thin-film magnetic coil means being disposed on said semiconductor plate and forming therewith a monolithic integrated circuit.

6. A measurement trandsucer, as claimed in claim 5, wherein said integrated circuit comprises a first current source, for supplying said alternating premagnetizing current, a second current source connected to said magnetic-field comparator means, an amplifier having an input thereof connected to said magnetic-field comparator means, a threshold switch having an input thereof connected to the output of said amplifier, and a signal processor having an input thereof connected to the output of said threshold switch.

7. A measurement transducer as claimed in claim 6, wherein said signal processor is an analog signal processor.

8. A measurement transducer as claimed in claim 6, wherein said signal processor is a digital signal processor.

9. A measurement transducer as claimed in claim 6, wherein said signal processor includes a multiplier.

10. A measurement transducer as claimed in claim 9, wherein said magnetic field is generated by an alternating current to be measured, and is proportional thereto, and wherein said multiplier includes means for forming a product from the instantaneous value of said current to be measured and the instantaneous value of an alternating voltage, and further comprising a counter post-coupled to said multiplier for forming a time integral of said product.

11. A measurement transducer as claimed in claim 5, wherein said magnetic field is generated by a current to be measured, and is proportional thereto, and further comprising a substantially flat plate bent into a U-shape so as to include two substantially straight longitudinal legs for passing the current to be measured therethrough, and wherein said semiconductor plate is disposed between said legs.

12. A measurement transducer as claimed in claim 1, wherein said ferromagnetic material in each film has a predetermined anisotropic field strength, and wherein the strength of said auxiliary field along the hard magnetic axis of a corresponding film is about one third of said anisotropic field strength.

13. A measurement transducer as claimed in claim 1, wherein said first and second magnetic anisotropic films and said non-magnetic and electrically poorly conducting layer separating said films constitute a first film pair, and further comprising a second film pair similar to said first film pair, and third and fourth magnetic films, and wherein said first and second film pairs, and said third and fourth films are connected to one another so as to form a bridge.

14. A measurement transducer as claimed in claim 1, wherein said thin-film magnetic coil means includes first and second groups of conducting paths disposed parallel to one another, each group being disposed in a respective plane, said groups being disposed in planes below and above respectively of said magnetic-field comparator means, and wherein opposite ends of each conducting path of one group are connected to ends of respective consecutive conducting paths of the other group.

15. A measurement transducer as claimed in claim 1, wherein each magnetic film has a longitudinal rim, said longitudinal rims being connected to one another.

16. A measurement transducer as claimed in claim 1, wherein said magnetic films are connected in parallel.

* * * * *